(12) United States Patent
Lim

(10) Patent No.: US 12,108,802 B2
(45) Date of Patent: *Oct. 8, 2024

(54) AEROSOL GENERATING DEVICE AND METHOD FOR CONTROLLING SAME

(71) Applicant: KT&G CORPORATION, Daejeon (KR)

(72) Inventor: Hun Il Lim, Seoul (KR)

(73) Assignee: KT&G CORPORATION, Daejeon (KR)

( * ) Notice: Subject to any disclaimer, the term of this patent is extended or adjusted under 35 U.S.C. 154(b) by 39 days.

This patent is subject to a terminal disclaimer.

(21) Appl. No.: 17/530,261

(22) Filed: Nov. 18, 2021

(65) Prior Publication Data

US 2022/0071293 A1 Mar. 10, 2022

Related U.S. Application Data

(63) Continuation of application No. 16/639,021, filed as application No. PCT/KR2018/012810 on Oct. 26, 2018.

(30) Foreign Application Priority Data

Oct. 30, 2017 (KR) .................. 10-2017-0142578
May 3, 2018 (KR) .................. 10-2018-0051467

(51) Int. Cl.
*A24F 40/50* (2020.01)
*A24B 15/167* (2020.01)
(Continued)

(52) U.S. Cl.
CPC ............ *A24F 40/51* (2020.01); *A24B 15/167* (2016.11); *A24D 1/20* (2020.01); *A24D 3/17* (2020.01);
(Continued)

(58) Field of Classification Search
CPC .................................. A24F 15/01; A24F 40/50
See application file for complete search history.

(56) References Cited

U.S. PATENT DOCUMENTS 5,348,027 A 9/1994 Barnes et al.
5,388,594 A 2/1995 Counts et al.
(Continued)

FOREIGN PATENT DOCUMENTS

CA 2778903 A1 5/2011
CA 2 970 045 A1 6/2016
(Continued)

OTHER PUBLICATIONS

Extended European Search Report dated Oct. 15, 2021 in European Application No. 18872138.5.
(Continued)

*Primary Examiner* — Russell E Sparks
(74) *Attorney, Agent, or Firm* — LEE, HONG, DEGERMAN, KANG & WAIMEY

(57) ABSTRACT

An aerosol generating device includes: a case into which a cigarette is to be inserted; a cap detachably coupled to a top portion of the case; a cover configured to slide on a top surface of the cap so as to open or close a cigarette insertion hole; a first sensor configured to sense whether the cigarette insertion hole is open or closed; and a controller configured to determine whether the cigarette insertion hole is open or closed based on a signal sensed by the first sensor and set an operational mode of the aerosol generating device as an ON mode or an OFF mode based on a result of the determining.

8 Claims, 11 Drawing Sheets

(51) Int. Cl.

| | | |
|---|---|---|
| *A24D 1/20* | (2020.01) | |
| *A24D 3/17* | (2020.01) | |
| *A24F 15/01* | (2020.01) | |
| *A24F 40/40* | (2020.01) | |
| *A24F 40/42* | (2020.01) | |
| *A24F 40/44* | (2020.01) | |
| *A24F 40/46* | (2020.01) | |
| *A24F 40/485* | (2020.01) | |
| *A24F 40/51* | (2020.01) | |
| *A24F 40/57* | (2020.01) | |
| *A24F 40/60* | (2020.01) | |
| *A24F 40/65* | (2020.01) | |
| *A24F 40/90* | (2020.01) | |
| *A24F 40/95* | (2020.01) | |
| *F21V 3/00* | (2015.01) | |
| *F21V 5/00* | (2018.01) | |
| *G02B 19/00* | (2006.01) | |
| *H05B 3/54* | (2006.01) | |
| *H05K 1/02* | (2006.01) | |
| *H05K 1/14* | (2006.01) | |
| *H05K 1/18* | (2006.01) | |
| *A24F 40/10* | (2020.01) | |
| *A24F 40/20* | (2020.01) | |
| *A24F 40/30* | (2020.01) | |
| *F21Y 115/10* | (2016.01) | |

(52) U.S. Cl.
CPC ............ *A24F 15/01* (2020.01); *A24F 40/40* (2020.01); *A24F 40/42* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/10* (2020.01); *A24F 40/20* (2020.01); *A24F 40/30* (2020.01); *F21Y 2115/10* (2016.08); *H05K 2201/012* (2013.01); *H05K 2201/0154* (2013.01); *H05K 2201/10219* (2013.01)

(56) References Cited

U.S. PATENT DOCUMENTS

| | | |
|---|---|---|
| 5,408,574 A | 4/1995 | Deevi et al. |
| 5,505,214 A | 4/1996 | Collins et al. |
| 5,555,476 A | 9/1996 | Suzuki et al. |
| 5,665,262 A | 9/1997 | Hajaligol et al. |
| 5,692,525 A | 12/1997 | Counts et al. |
| 5,723,228 A | 3/1998 | Okamoto |
| 5,750,964 A | 5/1998 | Counts et al. |
| 5,878,752 A | 3/1999 | Adams et al. |
| 5,949,346 A | 9/1999 | Suzuki et al. |
| 6,026,820 A | 2/2000 | Baggett, Jr. et al. |
| 6,615,840 B1 | 9/2003 | Fournier et al. |
| 6,803,550 B2 | 10/2004 | Sharpe et al. |
| 7,082,825 B2 | 8/2006 | Aoshima et al. |
| 7,682,571 B2 | 3/2010 | Kim et al. |
| 8,205,622 B2 | 6/2012 | Pan |
| 8,558,147 B2 | 10/2013 | Greim et al. |
| 8,602,037 B2 | 12/2013 | Inagaki |
| 8,833,364 B2 | 9/2014 | Buchberger |
| 9,084,440 B2 | 7/2015 | Zuber et al. |
| 9,165,484 B2 | 10/2015 | Choi |
| 9,295,286 B2 | 3/2016 | Shin |
| 9,405,148 B2 | 8/2016 | Chang et al. |
| 9,420,829 B2 | 8/2016 | Thorens et al. |
| 9,516,899 B2 | 12/2016 | Plojoux et al. |
| 9,532,600 B2 | 1/2017 | Thorens et al. |
| 9,693,587 B2 | 7/2017 | Plojoux et al. |
| 9,713,345 B2 | 7/2017 | Farine et al. |
| 9,770,055 B2 | 9/2017 | Cameron et al. |
| 9,844,234 B2 | 12/2017 | Thorens et al. |
| 9,848,651 B2 | 12/2017 | Wu |
| 9,854,845 B2 | 1/2018 | Plojoux et al. |
| 10,070,667 B2 | 9/2018 | Lord et al. |
| 10,085,481 B2 * | 10/2018 | Verleur ................. A24F 40/42 |
| 10,104,909 B2 | 10/2018 | Han et al. |
| 10,104,911 B2 | 10/2018 | Thorens et al. |
| 10,136,673 B2 | 11/2018 | Mironov |
| 10,143,232 B2 | 12/2018 | Talon |
| 10,236,708 B2 | 3/2019 | Schennum et al. |
| 10,285,449 B2 | 5/2019 | Murison et al. |
| 10,390,564 B2 | 8/2019 | Fernando et al. |
| 10,412,994 B2 * | 9/2019 | Schennum ............ H02J 7/0042 |
| 10,426,193 B2 | 10/2019 | Schennum et al. |
| 10,548,350 B2 | 2/2020 | Greim et al. |
| 10,617,149 B2 | 4/2020 | Malgat et al. |
| 10,701,973 B2 | 7/2020 | Lee |
| 10,736,358 B2 * | 8/2020 | Ding ................... H05B 1/0297 |
| 10,842,194 B2 | 11/2020 | Batista et al. |
| 11,051,550 B2 | 7/2021 | Lin et al. |
| 11,439,188 B2 * | 9/2022 | Lin ........................ A24F 40/90 |
| 2003/0226837 A1 | 12/2003 | Blake et al. |
| 2004/0089314 A1 | 5/2004 | Felter et al. |
| 2004/0149737 A1 | 8/2004 | Sharpe et al. |
| 2005/0142036 A1 | 6/2005 | Kim et al. |
| 2006/0267614 A1 | 11/2006 | Lee et al. |
| 2007/0007266 A1 | 1/2007 | Sasaki et al. |
| 2007/0074734 A1 | 4/2007 | Braunshteyn et al. |
| 2007/0246382 A1 | 10/2007 | He |
| 2010/0313901 A1 | 12/2010 | Fernando et al. |
| 2011/0226236 A1 | 9/2011 | Buchberger |
| 2013/0014772 A1 | 1/2013 | Liu |
| 2013/0228191 A1 | 9/2013 | Newton |
| 2013/0255675 A1 | 10/2013 | Liu |
| 2014/0069424 A1 | 3/2014 | Poston et al. |
| 2014/0217085 A1 | 8/2014 | Alima |
| 2014/0261487 A1 | 9/2014 | Chapman et al. |
| 2014/0286630 A1 | 9/2014 | Buchberger |
| 2014/0339509 A1 | 11/2014 | Choi et al. |
| 2014/0345633 A1 | 11/2014 | Talon et al. |
| 2014/0353856 A1 | 12/2014 | Dubief |
| 2015/0020831 A1 | 1/2015 | Weigensberg et al. |
| 2015/0223520 A1 | 8/2015 | Phillips et al. |
| 2015/0230521 A1 | 8/2015 | Talon |
| 2015/0282527 A1 | 10/2015 | Henry, Jr. |
| 2015/0327596 A1 | 11/2015 | Alarcon et al. |
| 2016/0103364 A1 | 4/2016 | Nam et al. |
| 2016/0128386 A1 | 5/2016 | Chen |
| 2016/0174613 A1 | 6/2016 | Zuber et al. |
| 2016/0205998 A1 | 7/2016 | Matsumoto et al. |
| 2016/0321879 A1 | 11/2016 | Oh et al. |
| 2016/0324216 A1 | 11/2016 | Li et al. |
| 2016/0345625 A1 | 12/2016 | Liu |
| 2017/0020195 A1 | 1/2017 | Cameron |
| 2017/0042227 A1 | 2/2017 | Gavrielov et al. |
| 2017/0055589 A1 | 3/2017 | Fernando et al. |
| 2017/0119051 A1 | 5/2017 | Blandino et al. |
| 2017/0143041 A1 | 5/2017 | Batista et al. |
| 2017/0188634 A1 | 7/2017 | Plojoux et al. |
| 2017/0197043 A1 | 7/2017 | Buchberger |
| 2017/0197046 A1 | 7/2017 | Buchberger |
| 2017/0214261 A1 | 7/2017 | Gratton |
| 2017/0238609 A1 | 8/2017 | Schlipf |
| 2017/0295844 A1 | 10/2017 | Thevenaz et al. |
| 2017/0325505 A1 | 11/2017 | Force et al. |
| 2017/0347715 A1 | 12/2017 | Mironov et al. |
| 2018/0027878 A1 | 2/2018 | Dendy et al. |
| 2018/0028993 A1 | 2/2018 | Dubief |
| 2018/0160733 A1 | 6/2018 | Leadley et al. |
| 2018/0199630 A1 | 7/2018 | Qiu |
| 2019/0059448 A1 | 2/2019 | Talon |
| 2019/0159524 A1 | 5/2019 | Qiu |
| 2019/0281896 A1 | 9/2019 | Chapman et al. |

(56) References Cited

U.S. PATENT DOCUMENTS

| | | |
|---|---|---|
| 2020/0093177 A1 | 3/2020 | Han et al. |
| 2020/0093185 A1 | 3/2020 | Lim |
| 2020/0094997 A1 | 3/2020 | Menon et al. |
| 2020/0154765 A1 | 5/2020 | Lee et al. |
| 2020/0196670 A1 | 6/2020 | Alarcon et al. |
| 2020/0221782 A1 | 7/2020 | Lim |
| 2020/0260790 A1 | 8/2020 | Kaufman et al. |
| 2020/0305240 A1 | 9/2020 | Holoubek et al. |
| 2020/0329772 A1 | 10/2020 | Kim et al. |
| 2020/0359681 A1 | 11/2020 | Han et al. |
| 2020/0375251 A1 | 12/2020 | Borges et al. |
| 2020/0404969 A1 | 12/2020 | Zuber et al. |
| 2021/0153546 A1* | 5/2021 | Digard ............ A24B 15/24 |

FOREIGN PATENT DOCUMENTS

| | | |
|---|---|---|
| CA | 3080145 | 10/2018 |
| CN | 1078621 A | 11/1993 |
| CN | 1126425 A | 7/1996 |
| CN | 1190335 A | 8/1998 |
| CN | 101324490 A | 12/2008 |
| CN | 101518361 A | 9/2009 |
| CN | 202385727 U | 8/2012 |
| CN | 102665459 A | 9/2012 |
| CN | 103099319 A | 5/2013 |
| CN | 202907797 U | 5/2013 |
| CN | 103271447 A | 9/2013 |
| CN | 103519351 A | 1/2014 |
| CN | 103974635 A | 8/2014 |
| CN | 103974638 A | 8/2014 |
| CN | 103997922 A | 8/2014 |
| CN | 104146353 A | 11/2014 |
| CN | 204120226 U | 1/2015 |
| CN | 204146340 U | 2/2015 |
| CN | 204393344 U | 6/2015 |
| CN | 104886776 A | 9/2015 |
| CN | 105188430 A | 12/2015 |
| CN | 205072064 U | 3/2016 |
| CN | 205180371 U | 4/2016 |
| CN | 105722416 A | 6/2016 |
| CN | 205358225 U | 7/2016 |
| CN | 205456064 U | 8/2016 |
| CN | 106136331 A | 11/2016 |
| CN | 205671480 U | 11/2016 |
| CN | 106235419 A | 12/2016 |
| CN | 205831079 U | 12/2016 |
| CN | 106418729 A | 2/2017 |
| CN | 106473232 A | 3/2017 |
| CN | 106723379 A | 5/2017 |
| CN | 106998816 A | 8/2017 |
| CN | 206442590 U | 8/2017 |
| CN | 206443214 U | 8/2017 |
| CN | 107183789 A | 9/2017 |
| CN | 107278125 A | 10/2017 |
| CN | 206547882 U | 10/2017 |
| CN | 108013512 A | 5/2018 |
| CN | 110325058 A | 10/2019 |
| CN | 110958841 A | 4/2020 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 0 822 760 B1 | 6/2003 |
| EP | 1 947 965 A2 | 7/2008 |
| EP | 2 201 850 A1 | 6/2010 |
| EP | 2201850 | 6/2010 |
| EP | 2 316 286 A1 | 5/2011 |
| EP | 2 327 318 A1 | 6/2011 |
| EP | 2 340 729 A1 | 7/2011 |
| EP | 2368449 A1 | 9/2011 |
| EP | 2 677 273 A1 | 12/2013 |
| EP | 2 921 065 A1 | 9/2015 |
| EP | 3171720 | 5/2017 |
| EP | 3 257 386 B1 | 6/2019 |
| EP | 3 248 486 B1 | 8/2019 |
| EP | 3 569 076 A1 | 11/2019 |
| EP | 3 248 485 B1 | 4/2020 |
| EP | 3 656 229 A2 | 5/2020 |
| GB | 2514893 A | 12/2014 |
| JP | 62-15793 A | 1/1987 |
| JP | 6-73784 U | 10/1994 |
| JP | 7-72809 A | 3/1995 |
| JP | 7-184627 A | 7/1995 |
| JP | 9-75058 A | 3/1997 |
| JP | 9-161822 A | 6/1997 |
| JP | 9-228919 A | 9/1997 |
| JP | 2003-527127 A | 9/2003 |
| JP | 2004-212102 A | 7/2004 |
| JP | 2005-199913 A | 7/2005 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2013-509160 A | 3/2013 |
| JP | 2013-524835 A | 6/2013 |
| JP | 2014-216287 A | 11/2014 |
| JP | 2014-533513 A | 12/2014 |
| JP | 2015-13192 A | 1/2015 |
| JP | 2015-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-510270 A | 4/2017 |
| JP | 2017-511123 A | 4/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |
| KR | 10-2016-0082570 A | 7/2016 |
| KR | 10-2016-0086118 A | 7/2016 |
| KR | 10-2016-0088163 A | 7/2016 |

(56) References Cited

FOREIGN PATENT DOCUMENTS

| | | |
|---|---|---|
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A1 | 10/2017 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/050964 A1 | 5/2011 |
| WO | 2011/063970 A1 | 6/2011 |
| WO | 2013/102609 A2 | 7/2013 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/174657 A1 | 11/2015 |
| WO | 2015/177046 A1 | 11/2015 |
| WO | 2015/189388 A1 | 12/2015 |
| WO | 2016/009202 A1 | 1/2016 |
| WO | 2016/012795 A1 | 1/2016 |
| WO | 2016012795 | 1/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/199065 A1 | 12/2016 |
| WO | 2016/199066 A1 | 12/2016 |
| WO | 2016/207407 A1 | 12/2016 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.
Office Action issued Aug. 12, 2019 in Korean Application No. 10-2019-0033722.
Office Action issued Jul. 2, 2019 in Korean Application No. 10-2019-0017392.
Office Action issued Jul. 3, 2019 in Korean Application No. 10-2019-0016835.
Office Action issued May 18, 2019 in Korean Application No. 10-2018-0090063.
Office Action issued Oct. 25, 2019 in Korean Application No. 10-2018-0078296.
Office Action issued Oct. 15, 2019 in Korean Application No. 10-2018-0074188.
Office Action issued Oct. 8, 2019 in Korean Application No. 10-2018-0072992.
Office Action issued Oct. 8, 2019 in Korean Application No. 10-2018-0072935.
Office Action issued Sep. 6, 2019 in Korean Application No. 10-2018-0069645.
Office Action issued Jul. 10, 2019 in Korean Application No. 10-2018-0064487.
Office Action issued Jun. 24, 2019 in Korean Application No. 10-2018-0062137.
Office Action issued Jun. 19, 2019 in Korean Application No. 10-2018-0059580.
Office Action issued May 13, 2019 in Korean Application No. 10-2018-0058596.
Office Action issued May 3, 2019 in Korean Application No. 10-2018-0055120.
Office Action issued Dec. 9, 2019 in Korean Application No. 10-2018-0052133.
Office Action issued Dec. 9, 2019 in Korean Application No. 10-2018-0051469.
Office Action issued Dec. 9, 2019 in Korean Application No. 10-2018-0051467.
International Search Report issued Apr. 16, 2019 in International Application No. PCT/KR2018/012899.
International Search Report issued Apr. 26, 2019 in International Application No. PCT/KR2018/012895.
International Search Report issued May 17, 2019 in International Application No. PCT/KR2018/012810.
International Search Report issued May 17, 2019 in International Application No. PCT/KR2018/012809.
International Search Report issued May 17, 2019 in International Application No. PCT/KR2018/012808.
International Search Report issued May 3, 2019 in International Application No. PCT/KR2018/012807.
International Search Report issued May 17, 2019 in International Application No. PCT/KR2018/012776.
International Search Report issued Apr. 3, 2019 in International Application No. PCT/KR2018/012775.
International Search Report issued Apr. 3, 2019 in International Application No. PCT/KR2018/012774.
International Search Report issued Apr. 3, 2019 in International Application No. PCT/KR2018/012773.
International Search Report issued May 20, 2019 in International Application No. PCT/KR2018/012685.
International Search Report issued May 21, 2019 in International Application No. PCT/KR2018/012676.
International Search Report issued Nov. 26, 2018 in International Application No. PCT/KR2018/005767.
International Search Report issued Aug. 28, 2018 in International Application No. PCT/KR2018/005693.
International Search Report issued Nov. 2, 2018 in International Application No. PCT/KR2018/005306.
Extended European Search Report issued Jan. 15, 2021 in European Application No. 18799246.6.
Office Action issued May 25, 2020 in Russian Application No. 2019135871.
Office Action issued Jun. 10, 2020 in Korean Application No. 10-2018-0052137.
Office Action issued Oct. 5, 2020 in Korean Application No. 10-2020-0090577.
Office Action issued Oct. 16, 2020 in Korean Application No. 10-2020-0092553.
Extended European Search Report issued Nov. 16, 2020 in European Application No. 20189002.7.
Office Action issued Dec. 8, 2020 in Russian Application No. 2020113632.
Office Action issued Nov. 25, 2020 in Russian Application No. 2020124810.

(56) References Cited

OTHER PUBLICATIONS

Office Action issued Jan. 26, 2021 in Japanese Application No. 2020-502671.
Office Action issued Dec. 22, 2020 in Japanese Application No. 2020-502181.
Office Action issued Dec. 22, 2020 in Japanese Application No. 2020-503856.
Extended European Search Report issued Nov. 13, 2020 in European Application No. 20188970.6.
Office Action issued Nov. 10, 2020 in Japanese Application No. 2020-523671.
Office Action issued Nov. 24, 2020 in Russian Application No. 2020124811.
Communication issued Jul. 27, 2020 by the Russian Patent Office in application No. 2020110821.
Communication issued Jun. 11, 2020 by the Korean Patent Office in application No. 10-2018-0051469.
European Patent Office Application Serial No. 21209166.4, Search Report dated May 9, 2022, 13 pages.
Communication issued Feb. 24, 2021 by the Japanese Patent Office in application No. 2020-503962.
Communication Mar. 23, 2021 by the Japanese Patent Office in application No. 2020-522897.
Communication issued Mar. 2, 2021 by the Japanese Patent Office in application No. 2020-523669.
Communication issued Mar. 30, 2021 by the Japanese Patent Office in application No. 2020-501446.
Communication issued Mar. 16, 2021 by the Japanese Patent Office in application No. 2020-521441.
Communication issued Feb. 9, 2021 by the Japanese Patent Office in application No. 2020-501205.
Communication issued Mar. 16, 2021 by the European Patent Office in application No. 18806877.9.
Extended European Search Report issued Sep. 9, 2021 in European Application No. 18873562.5.
Office Action issued Aug. 3, 2021 in Japanese Application No. 2020-503856.
Extended European Search Report issued Aug. 18, 2021 in European Application No. 18874344.7.
Extended European Search Report issued Jul. 30, 2021 in European Application No. 18874446.0.
Extended European Search Report issued Aug. 17, 2021 in European Application No. 18872432.2.
Office Action issued Aug. 17, 2021 in Japanese Application No. 2020-503962.
Extended European Search Report dated Aug. 10, 2021 in European Application No. 18873846.2.
Extended European Search Report issued Aug. 17, 2021 in European Application No. 18873943.7.
Extended European Search Report issued Aug. 10, 2021 in European Application No. 18874742.2.
Extended European Search Report issued Aug. 12, 2021 in European Application No. 18874837.0.
Extended European Search Report issued Aug. 20, 2021 in European Application No. 18874962.6.
Extended European Search Report issued Aug. 6, 2021 in European Application No. 18872527.9.
Extended European Search Report issued Sep. 2, 2021 in European Application No. 18874839.6.
Extended European Search Report issued Jul. 20, 2021 in European Application No. 18872006.4.
Office Action issued Sep. 3, 2021 in Chinese Application No. 201880035480.1.
Office Action issued Aug. 11, 2021 in Chinese Application No. 201880029050.9.
United States Patent and Trademark Office U.S. Appl. No. 16/639,021, Office Action dated Nov. 10, 2021, 14 pages.
Merriam-Webster Dictionary, Definition of Cigarette, https://www.merriam-webster.com/dictionary/cigarette (Year: 2021).
Merriam-Webster Dictionary, Definition of Vaporizer, https://www.merriam-webster.com/dictionary/vaporizer (Year: 2021).
Communication issued Apr. 5, 2019 in Korean Patent Application No. 10-2019-0017393.
Communication issued Apr. 25, 2019 in Korean Patent Application No. 10-2019-0033722.
Communication issued Apr. 25, 2019 in Korean Patent Application No. 10-2019-0033723.
Communication issued Jun. 7, 2021 in Canadian Patent Application No. 3,076,886.
Communication issued Feb. 9, 2018 in Korean Patent Application No. 10-2017-0058786.

\* cited by examiner

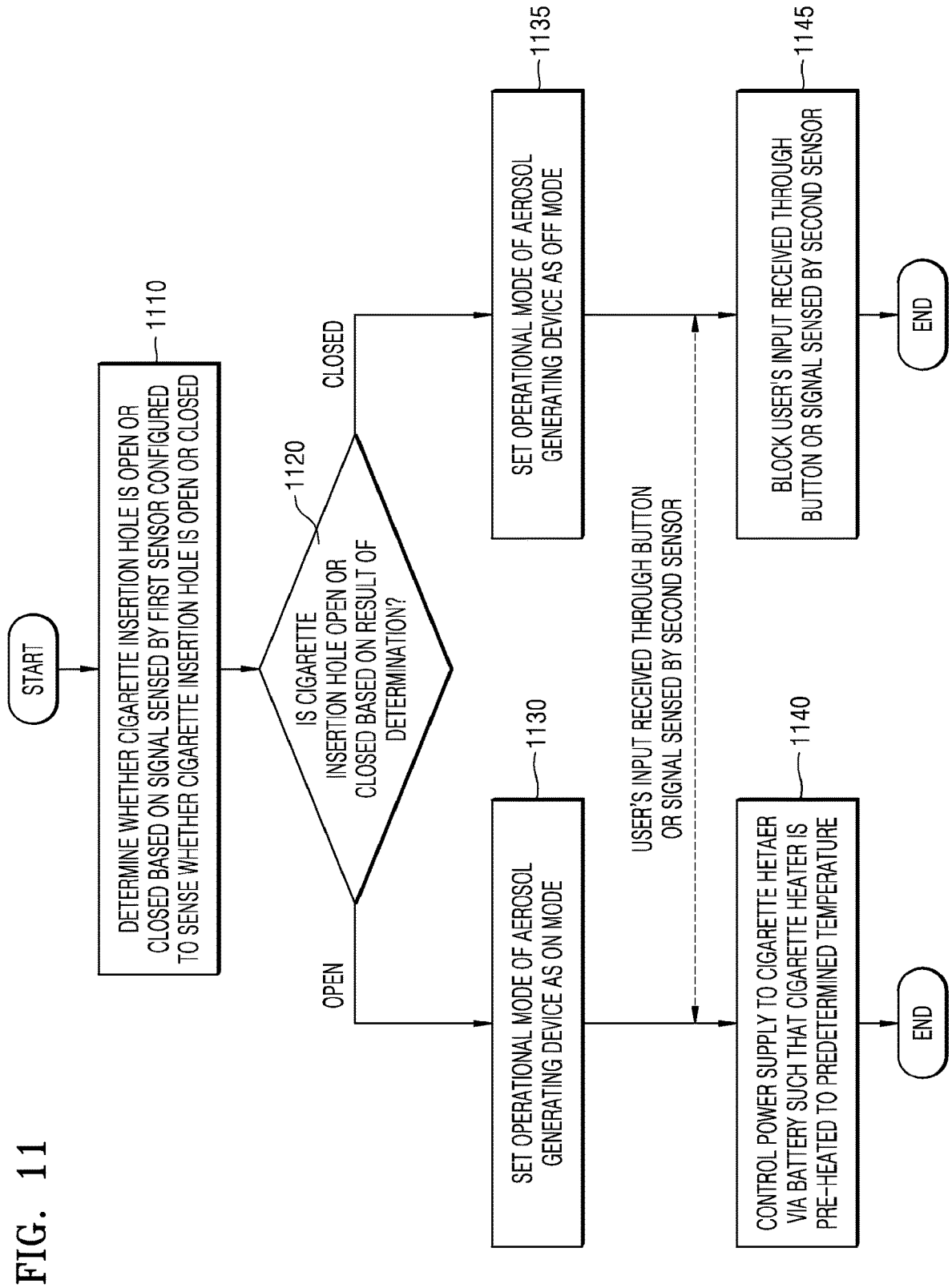

AEROSOL GENERATING DEVICE AND METHOD FOR CONTROLLING SAME

CROSS-REFERENCE TO RELATED APPLICATIONS

This application is a continuation of U.S. patent application Ser. No. 16/639,021, filed on Feb. 13, 2020, which is the National Stage filing under 35 U.S.C. 371 of International Application No. PCT/KR2018/012810, filed on Oct. 26, 2018, which claims the benefit of earlier filing date and right of priority to Korean Patent Application Nos. 10-2017-0142578, filed Oct. 30, 2017 and 10-2018-0051467, filed on May 3, 2018, the contents of which are all hereby incorporated by reference herein their entirety.

TECHNICAL FIELD

The present disclosure relates to an aerosol generating device and a method of controlling the aerosol generating device, and more particularly, to an aerosol generating device for generating aerosol having a rich flavor by passing the aerosol generated by a vaporizer through a cigarette, and a method of controlling the aerosol generating device.

BACKGROUND ART

Recently, demand for an aerosol generating device capable of generating aerosol via a noncombustible method has increased. As a result, studies about a noncombustible aerosol generating device that have been actively conducted.

General aerosol generating devices are portable devices which have similar sizes to general cigarettes and include buttons for receiving a user's input. Operations of the aerosol generating devices may be controlled based on the user's input received via the buttons included in the aerosol generating devices. In addition, when a user carries the aerosol generating device in a bag or a pocket, a button on the aerosol generating device may be wrongly pressed, and thus, unintentional operations of the aerosol generating device may be performed. For example, even when a user is not smoking, when the button is wrongly pressed, a heating operation of the aerosol generating device may be performed, thereby causing a safety problem.

Also, even when a user is not smoking, a general aerosol generating device maintains electrical connection between a battery and heaters included in the aerosol generating device and stands by for signals to be received from a button or sensors included in the aerosol generating device. Thus, unnecessary power consumption may occur.

Therefore, a method of controlling an aerosol generating device and preventing the occurrence of a safety problem and unnecessary power consumption during a user's use of the aerosol generating device is required.

DESCRIPTION OF EXEMPLARY EMBODIMENTS

Solution to Problem

Provided are an aerosol generating device and a method of controlling the same, according to various exemplary embodiments. Technical objectives of the present disclosure are not limited to the described technical objectives and other technical objectives may be derived from the exemplary embodiments to be described hereinafter. According to an aspect of the present disclosure, an aerosol generating device includes: a case into which a cigarette is inserted; a cap coupled to a top portion of the case to be detachable from the case; a cover configured to perform sliding movement along a top surface of the cap so as to open or close a cigarette insertion hole; a first sensor configured to sense whether the cigarette insertion hole is open or closed; and a controller configured to determine whether the cigarette insertion hole is open or closed based on a signal sensed by the first sensor and set an operational mode of the aerosol generating device as an ON mode or an OFF mode based on a result of the determining.

Advantageous Effects of Disclosure

According to the present disclosure, an aerosol generating device and a method of controlling the same are provided. An aerosol generating device includes: a case into which a cigarette is inserted; a cap detachably coupled to a top portion of the case; a cover configured to slide on a top surface of the cap so as to open or close a cigarette insertion hole; a first sensor configured to sense whether the cigarette insertion hole is open or closed; and a controller, wherein the controller is configured to determine whether the cigarette insertion hole is open or closed based on a signal sensed by the first sensor and set an operational mode of the aerosol generating device as an ON mode or an OFF mode based on a result of the determining.

For example, the controller may be configured to set the operational mode of the aerosol generating device as the OFF mode, when the controller determines that the cigarette insertion hole is closed. When the operational mode of the aerosol generating device is the OFF mode, the controller may further be configured to electrically disconnect a battery from a heater and a vaporizer, block a user's input received through a button, and block a signal sensed by a second sensor, in order to 1) prevent the performance of an unintentional operation of the aerosol generating device due to wrong pressing of the button and 2) prevent unnecessary power consumption while a user is not smoking.

Also, the aerosol generating device according to the present disclosure 3) may further include a cover capable of sliding movement, in addition to a button, which is a component for receiving a user's input according to manipulation of a user, and thus, an additional method of controlling the aerosol generating device may be provided.

BRIEF DESCRIPTION OF DRAWINGS

FIG. 11 is a flowchart of another example of the method of controlling the aerosol generating device, according to one or more exemplary embodiments.

BEST MODE

Figure 1:
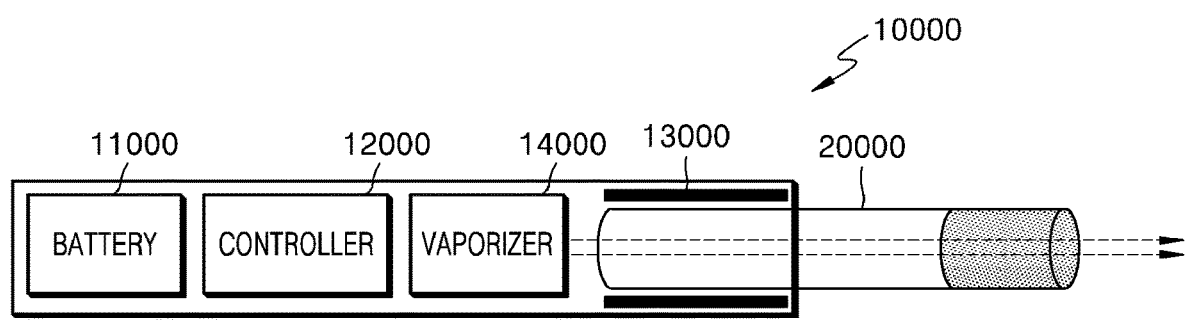
FIGS. 1 and 2 are diagrams showing examples in which a cigarette is inserted into an aerosol generating device.

According to an aspect of the present disclosure, an aerosol generating device includes: a case into which a cigarette is to be inserted; a cap detachably coupled to a top portion of the case; a cover configured to slide on a top surface of the cap so as to open or close a cigarette insertion hole; a first sensor configured to sense whether the cigarette insertion hole is open or closed; and a controller configured to determine whether the cigarette insertion hole is open or closed based on a signal sensed by the first sensor and set an operational mode of the aerosol generating device as an ON mode or an OFF mode based on a result of the determining.

The aerosol generating device may further include a second sensor configured to sense whether or not the cigarette is inserted into the case; a heater arranged in the case and configured to heat the cigarette inserted into the case; a vaporizer configured to accommodate a liquid composition and detachably coupled to the case, and while being coupled to the case, configured to transmit aerosol generated by heating the liquid composition to the cigarette; a battery configured to supply power to the controller, the heater, and the vaporizer; and a button configured to receive a user's input.

The controller may further be configured to set the operational mode of the aerosol generating device as the ON mode, in response to determining that the cigarette insertion hole is open, and when the operational mode of the aerosol generating device is the ON mode, the controller may further be configured to electrically connect the battery with the heater and the vaporizer so that the battery supplies power to the heater and the vaporizer, activate the button to receive the user's input, and activate the second sensor to sense whether or not the cigarette is inserted into the case.

According to some exemplary embodiments, when the operational mode of the aerosol generating device is the ON mode, the controller may further be configured to control power supply to the heater via the battery such that the heater is pre-heated to a predetermined temperature in response to the user's input being received through the activated button.

According to other exemplary embodiments, when the operational mode of the aerosol generating device is the ON mode, the controller may further be configured to determine whether or not the cigarette is inserted into the case based on a signal sensed by the activated second sensor, and, in response to being determined that the cigarette is inserted into the case, may be configured to control power supply to the heater via the battery such that the heater is pre-heated to a predetermined temperature.

The controller may be configured to set the operational mode of the aerosol generating device as the OFF mode, in response to determining that the cigarette insertion hole is closed, and, when the operational mode of the aerosol generating device is the OFF mode, the controller may further be configured to electrically disconnect the battery from the heater and the vaporizer, block the user's input received through the button, and block a signal sensed by the second sensor.

In addition, when the operational mode of the aerosol generating device is the OFF mode, the controller may further be configured to activate functions related to booting of the aerosol generating device, and the functions related to booting may include at least one of a clock function, a real time clock (RTC) function, and an interrupt function standing by for the signal sensed by the first sensor.

The first sensor may include an ON/OFF switch configured to generate an ON signal when the cover moves to open the cigarette insertion hole and generate an OFF signal when the cover moves to close the cigarette insertion hole. Also, the second sensor may include at least one of a Hall sensor configured to sense a change in a magnetic field generated from a metal material included in the cigarette, a mechanical switch configured to sense a physical change occurring when the cigarette is inserted, an infrared sensor configured to sense approaching of the cigarette, and an optical sensor configured to sense a pattern printed on a surface of the cigarette.

According to another aspect of the present disclosure, a method of controlling an aerosol generating device includes: determining whether a cigarette insertion hole is open or closed based on a signal sensed by a sensor included in the aerosol generating device; and setting an operational mode of the aerosol generating device as an ON mode or an OFF mode based on a result of the determining.

According to another aspect of the present disclosure, a computer-readable recording medium has recorded thereon one or more programs including instructions for executing the method described above.

MODE OF DISCLOSURE

Hereinafter, exemplary embodiments shown only as examples will be described in detail with reference to the accompanying drawings. Descriptions will be given below for only specifying the exemplary embodiments and will not limit or restrict the scope of claims of the disclosure. Aspects which could be easily derived by one of ordinary skill in the art from the detailed descriptions and exemplary embodiments are interpreted as being included in the scope of claims.

It will be further understood that the terms "comprises," "comprising," "includes" and/or "including," when used herein, do not necessarily indicate all of stated features, integers, steps, operations, elements, and/or components described in the specification and may preclude some of the stated features, the integers, steps, operations, elements, and/or components. Also, the terms do not preclude the presence or addition of one or more other features, integers, steps, operations, elements, components, and/or groups thereof.

Also, it will be understood that, although the terms first, second, etc. may be used herein to describe various elements, these elements should not be limited by these terms. These terms are only used to distinguish one element from another.

The terms used in the disclosure are selected from among common terms that are currently widely used in consideration of their function in the disclosure. However, the terms may be different according to an intention of one of ordinary skill in the art, a precedent, or the advent of new technology. Also, in particular cases, the terms are discretionally selected by the applicant of the disclosure, and the meaning of those terms will be described in detail in the corresponding part of the detailed description. Therefore, the terms used in the disclosure are not merely designations of the terms, but the terms are defined based on the meaning of the terms and content throughout the disclosure.

Throughout the specification, an "aerosol generating device" may refer to an aerosol generating device for generating aerosol by using an aerosol generating material, wherein the aerosol may be directly inhaled by the lungs of a user through the mouth of the user.

The present exemplary embodiments relate to an aerosol generating device and a method of controlling the same. Aspects well known to one of ordinary skill in the art will not be described in detail.

Figure 2:
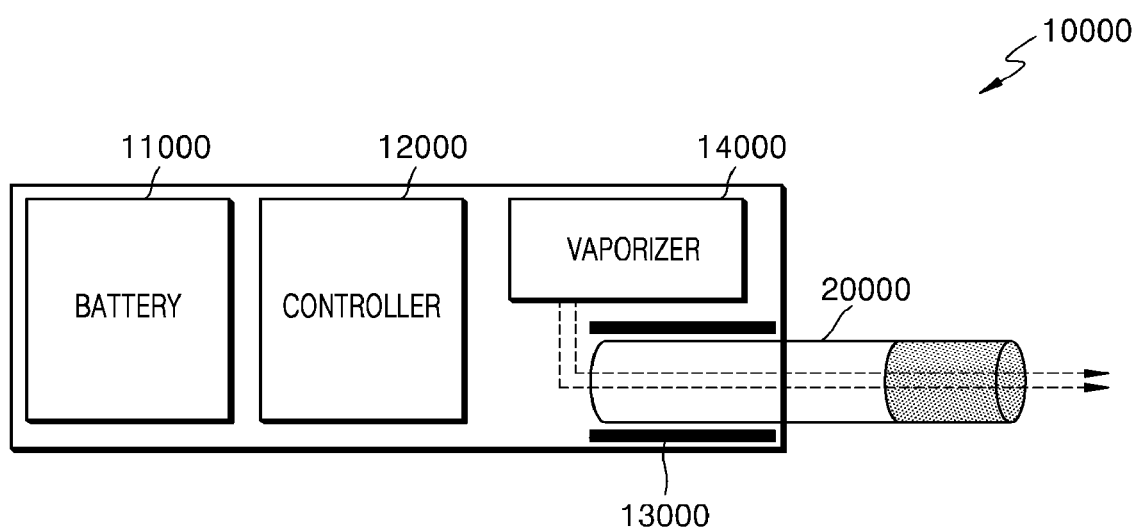

FIGS. 1 and 2 are diagrams showing examples in which a cigarette is inserted into an aerosol generating device.

Referring to FIGS. 1 and 2, an aerosol generating device 10000 includes a battery 11000, a controller 12000, a heater 13000, and a vaporizer 14000. Also, a cigarette 20000 may be inserted into an inner space of the aerosol generating device 10000.

FIGS. 1 and 2 only illustrate components of the aerosol generating device 10000, which are related to the present exemplary embodiment. Therefore, it will be understood by one of ordinary skill in the art related to the present exemplary embodiment that other general-purpose components may be further included in the aerosol generating device 10000, in addition to the components illustrated in FIG. 1.

Also, FIGS. 1 and 2 illustrate the aerosol generating device 10000 including the heater 13000. However, according to necessity, the heater 13000 may be omitted.

FIG. 1 illustrates that the battery 11000, the controller 12000, the vaporizer 14000, and the heater 13000 are arranged in series. Also, FIG. 2 illustrates that the vaporizer 14000 and the heater 13000 are arranged in parallel. However, the internal structure of the aerosol generating device 10000 is not limited to the structures illustrated in FIG. 1 or FIG. 2. In other words, according to the design of the aerosol generating device 10000, the battery 11000, the controller 12000, the vaporizer 14000, and the heater 13000 may be differently arranged.

When the cigarette 20000 is inserted into the aerosol generating device 10000, the aerosol generating device 10000 may operate the vaporizer 14000 to generate aerosol from the vaporizer 14000. The aerosol generated by the vaporizer 14000 is delivered to the user by passing through the cigarette 20000. The vaporizer 14000 will be described in more detail later.

The battery 11000 may supply power to be used for the aerosol generating device 10000 to operate. For example, the battery 11000 may supply power to heat the heater 13000 or the vaporizer 14000 and may supply power for operating the controller 12000. Also, the battery 11000 may supply power for operations of a display, a sensor, a motor, etc. mounted in the aerosol generating device 10000.

The controller 12000 may generally control operations of the aerosol generating device 10000. In detail, the controller 12000 may control not only operations of the battery 11000, the heater 13000, and the vaporizer 14000, but also operations of other components included in the aerosol generating device 10000. Also, the controller 12000 may check a state of each of the components of the aerosol generating device 10000 to determine whether or not the aerosol generating device 10000 is able to operate.

The controller 12000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater 13000 may be heated by the power supplied from the battery 11000. For example, when the cigarette 20000 is inserted into the aerosol generating device 10000, the heater 13000 may be located outside the cigarette 20000. Thus, the heated heater 13000 may increase a temperature of an aerosol generating material in the cigarette 20000.

The heater 13000 may include an electro-resistive heater. For example, the heater 13000 may include an electrically conductive track, and the heater 13000 may be heated when currents flow through the electrically conductive track. However, the heater 13000 is not limited to the example described above and may include all heaters which may be heated to a desired temperature. Here, the desired temperature may be pre-set in the aerosol generating device 10000 or may be set as a temperature desired by a user.

As another example, the heater 13000 may include an induction heater. In detail, the heater 13000 may include an electrically conductive coil for heating a cigarette in an induction heating method, and the cigarette may include a susceptor which may be heated by the induction heater.

FIGS. 1 and 2 illustrate that the heater 13000 is positioned outside the cigarette 20000, but the position of the heater 13000 is not limited thereto. For example, the heater 13000 may include a tube-type heating element, a plate-type heating element, a needle-type heating element, or a rod-type heating element, and may heat the inside or the outside of the cigarette 20000, according to the shape of the heating element.

Also, the aerosol generating device 10000 may include a plurality of heaters 13000. Here, the plurality of heaters 13000 may be inserted into the cigarette 20000 or may be arranged outside the cigarette 20000. Also, some of the plurality of heaters 13000 may be inserted into the cigarette 20000, and the others may be arranged outside the cigarette 20000. In addition, the shape of the heater 13000 is not limited to the shapes illustrated in FIGS. 1 and 2 and may include various shapes.

The vaporizer 14000 may generate aerosol by heating a liquid composition and the generated aerosol may pass through the cigarette 20000 to be delivered to a user. In other words, the aerosol generated via the vaporizer 14000 may move along an air flow passage of the aerosol generating device 10000 and the air flow passage may be configured such that the aerosol generated via the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generating device 10000 as independent modules.

The liquid storage may store a liquid composition. For example, the liquid composition may be a liquid including a tobacco-containing material having a volatile tobacco flavor component, or a liquid including a non-tobacco material. The liquid storage may be formed to be detachable from the vaporizer 14000 or may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be positioned as being wound around the liquid delivery element. The heating element may be heated by a current supply and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generating device 10000 may further include general-purpose components in addition to the battery 11000, the controller 12000, and the heater 13000. For example, the aerosol generating device 10000 may include a display capable of outputting visual information and/or a motor for outputting haptic information. Also, the aerosol generating device 10000 may include at least one sensor (a puff detecting sensor, a temperature detecting sensor, a cigarette insertion detecting sensor, etc.). Also, the aerosol generating device 10000 may be formed as a structure where, even when the cigarette 20000 is inserted into the aerosol generating device 10000, external air may be introduced or internal air may be discharged.

Although not illustrated in FIGS. 1 and 2, the aerosol generating device 10000 and an additional cradle may form together a system. For example, the cradle may be used to charge the battery 11000 of the aerosol generating device 10000. Alternatively, the heater 13000 may be heated when the cradle and the aerosol generating device 10000 are coupled to each other.

The cigarette 20000 may be similar as a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generating device 10000, and the second portion may be exposed to the outside. Alternatively, only a portion of the first portion may be inserted into the aerosol generating device 10000. Otherwise, a portion of the first portion and a portion of the second portion may be inserted into the aerosol generating device 10000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 10000. For example, opening and closing of the air passage and/or a size of the air passage may be adjusted by the user. Accordingly, the amount of smoke and a smoking satisfaction may be adjusted by the user. As another example, the external air may flow into the cigarette 20000 through at least one hole formed in a surface of the cigarette 20000.

Hereinafter, an example of the cigarette 20000 will be described with reference to FIG. 3.

Figure 3:
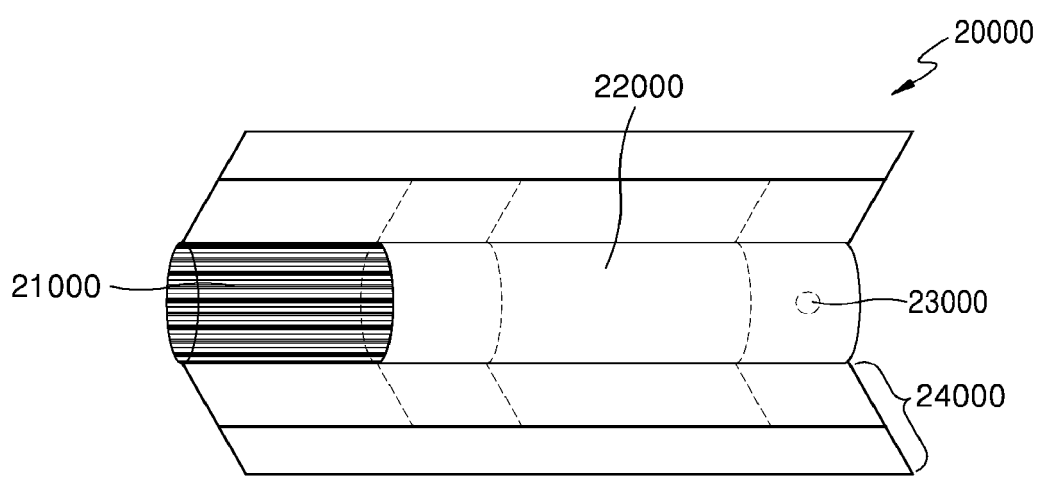
FIG. 3 is a drawing illustrating an example of a cigarette.

FIG. 3 is a drawing illustrating an example of a cigarette.

Referring to FIG. 3, the cigarette 20000 may include a tobacco rod 21000 and a filter rod 22000. The first portion described above with reference to FIGS. 1 and 2 may include the tobacco rod 21000, and the second portion may include the filter rod 22000.

FIG. 3 illustrates that the filter rod 22000 includes a single segment. However, the filter rod 22000 is not limited thereto. In other words, the filter rod 22000 may include a plurality of segments. For example, the filter rod 22000 may include a first segment configured to cool an aerosol and a second segment configured to filter a certain component included in the aerosol. Also, as necessary, the filter rod 22000 may further include at least one segment configured to perform other functions.

The cigarette 2000 may be packaged using at least one wrapper 24000. The wrapper 24000 may have at least one hole through which external air may be introduced or internal air may be discharged. For example, the cigarette 20000 may be packaged using one wrapper 24000. As another example, the cigarette 20000 may be doubly packaged using at least two wrappers 24000. For example, the tobacco rod 21000 may be packaged using a first wrapper, and the filter rod 22000 may be packaged using a second wrapper. Also, the tobacco rod 21000 and the filter rod 22000, which are respectively packaged using separate wrappers, may be coupled to each other, and the entire cigarette 20000 may be packaged using a third wrapper. When each of the tobacco rod 21000 and the filter rod 22000 includes a plurality of segments, each segment may be packaged using a separate wrapper. Also, the entire cigarette 20000 including the plurality of segments, which are respectively packaged using the separate wrappers may be combined and re-packaged together using another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed of tiny bits cut from a tobacco sheet. Also, the tobacco rod 21000 may be surrounded by a heat conductive material. For example, the heat-conducting material may be, but is not limited to, a metal foil such as aluminum foil. For example, the heat conductive material surrounding the tobacco rod 21000 may uniformly distribute heat transmitted to the tobacco rod 21000, and thus, the heat conductivity applied to the tobacco rod may be increased and taste of the tobacco may be improved. Also, the heat conductive material surrounding the tobacco rod 21000 may function as a susceptor heated by the induction heater. Here, although not illustrated in the drawings, the tobacco rod 21000 may further include an additional susceptor, in addition to the heat conductive material surrounding the tobacco rod 21000.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected onto the filter rod 22000, or an additional fiber coated with a flavoring liquid may be inserted into the filter rod 22000.

Also, the filter rod 22000 may include at least one capsule 23000. Here, the capsule 23000 may generate a flavor or aerosol. For example, the capsule 23000 may have a configuration in which a liquid containing a flavoring material is wrapped with a film. For example, the capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material for forming the cooling segment is not limited thereto. In some exemplary embodiments, the cooling segment may include a cellulose acetate filter having a plurality of holes. However, the cooling segment is not limited to the above-described example and any other cooling segment that is capable of cooling the aerosol may be used.

Although not illustrated in FIG. 3, the cigarette 20000 according to an exemplary embodiment may further include a front-end filter. The front-end filter may be located on a side of the tobacco rod 21000, which is the side not facing the filter rod 22000. The front-end filter may prevent the tobacco rod 21000 from being detached outwards and prevent a liquefied aerosol from flowing into the aerosol generating device 10000 (FIGS. 1 and 2) from the tobacco rod 21000, during smoking.

Figure 4:
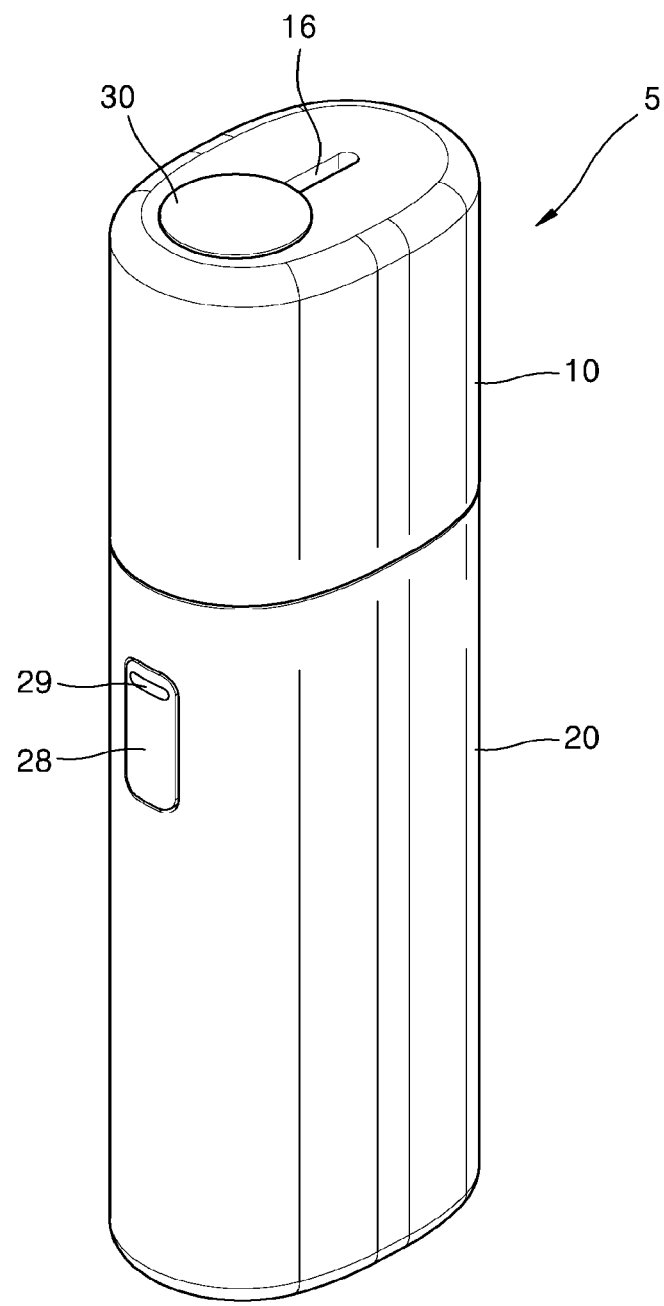
FIG. 4 is a perspective view of an aerosol generating device according to one or more exemplary embodiments.
Figure 5:
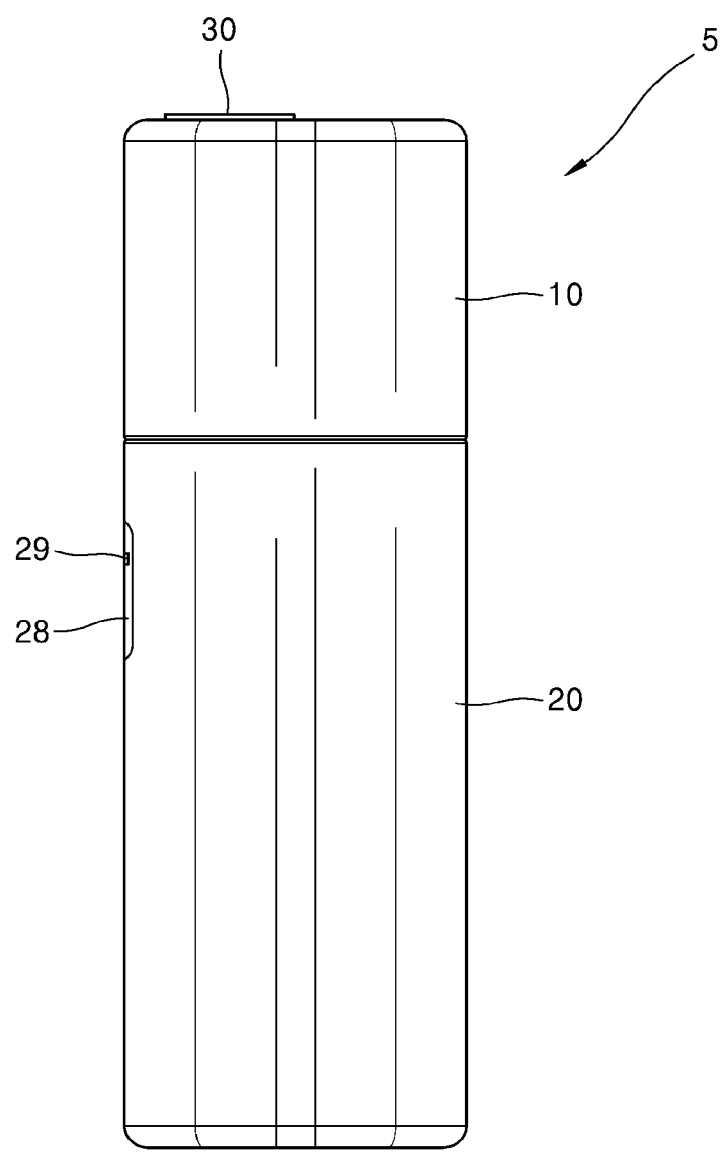
FIG. 5 is a side view of the aerosol generating device illustrated in FIG. 4.
Figure 6:
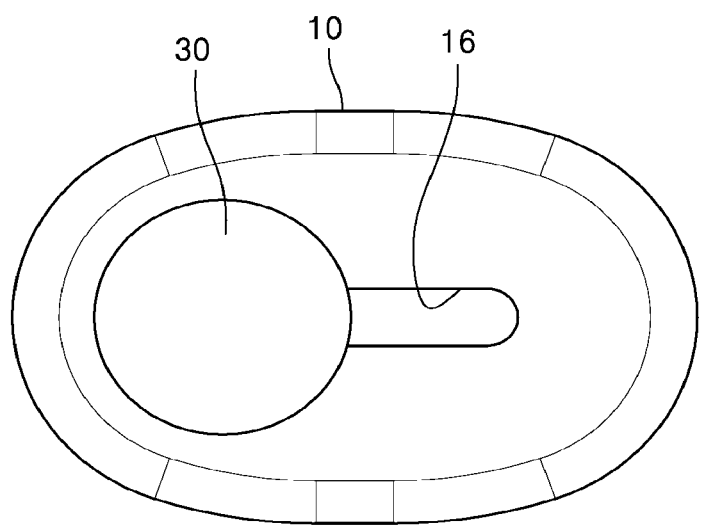
FIG. 6 is a top view of the aerosol generating device illustrated in FIG. 4.
Figure 7:
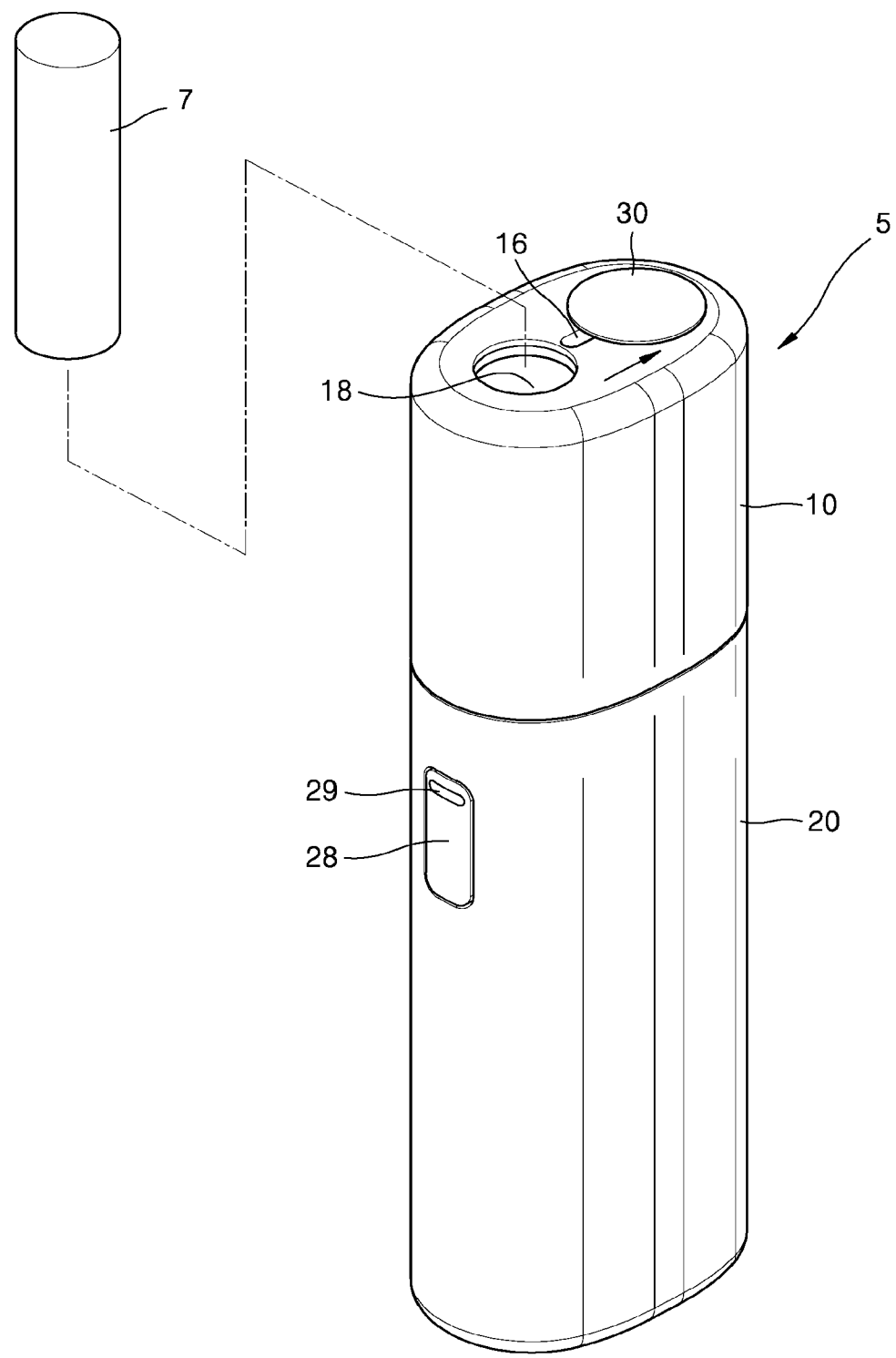
FIG. 7 is a perspective view showing an operational state of the aerosol generating device illustrated in FIG. 4.
Figure 8:
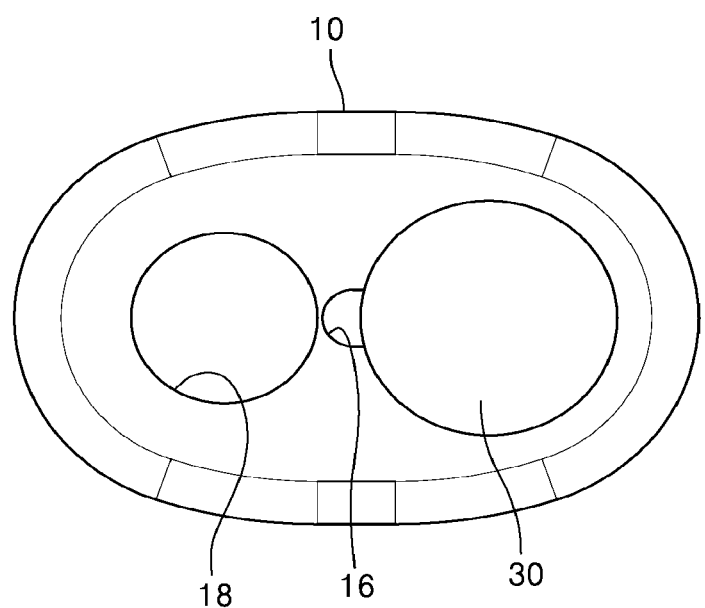
FIG. 8 is a top view of the aerosol generating device illustrated in FIG. 7.

FIG. 4 is a perspective view of an aerosol generating device according to an exemplary embodiment. FIG. 5 is a side view of the aerosol generating device illustrated in FIG. 4. FIG. 6 is a top view of the aerosol generating device illustrated in FIG. 4. FIG. 7 is a perspective view showing an operational state of the aerosol generating device illustrated in FIG. 4. FIG. 8 is a top view of the aerosol generating device illustrated in FIG. 7. An aerosol generating device 5 of FIGS. 4 through 8 may be an example of the aerosol generating device 10000 of FIGS. 1 and 2.

The aerosol generating device 5 according to the exemplary embodiment illustrated in FIGS. 4 through 8 may include a case 20 into which a cigarette 7 may be inserted. The cigarette 7 may correspond to the cigarette 20000 of FIGS. 1 through 3. Thus, similar descriptions will be repeated herein.

A cap 10 is coupled to an upper portion of the case 20. The cap 10 is detachably coupled to the case 20. A cover 30 is mounted on an upper surface of the cap 10 to be capable of performing sliding movement. However, a structure of the aerosol generating device 5 illustrated in FIGS. 4 through 8 is an example, and the disclosure is not limited thereto. For example, the case 20 and the cap 10 may be coupled to each other as an integral structure and may not be separable from each other.

A rail 16 extending in a sliding direction of the cover 30 and a cigarette insertion hole 18 into which the cigarette 7 is inserted are formed on the upper surface of the cap 10. The rail 16 may be exposed to the outside to connect the inside and the outside of the cap 10.

The cigarette insertion hole 18 is exposed to the outside when the cover 30 moves to a location illustrated in FIG. 8 along the rail 16 formed on the upper surface of the cap 10. Accordingly, the cigarette 7 may be inserted into the cigarette insertion hole 18.

Manners in which the cover 30 is coupled to the cap 10 are not limited to the structure of the exemplary embodiment illustrated in FIGS. 4 through 8. For example, the cover 30 may be coupled to the cap 10 via a hinge to open or close the cigarette insertion hole 18.

Various preparative operations may be performed when the cigarette insertion hole 18 opens as the cover 30 slides on the upper surface of the cap 10. For example, when the cigarette insertion hole 18 is opened as the cover 30 slides, an operational mode of the aerosol generating device 5 may be changed, internal heaters may be preliminarily heated, or a user may be recognized. Hereinafter, a method of controlling the aerosol generating device 5 in relation to opening the cigarette insertion hole 18 by the cover 30 sliding on the upper surface of the cap 10 is described in detail with reference to FIGS. 9 through 11.

A button 28 to be manipulated by a user and a light-emitting diode (LED) 29, which is a means for displaying an inner operational state of the aerosol generating device 5 by emitting light corresponding to one of predetermined various colors, are mounted outside the case 20 of the aerosol generating device 5.

A controller mounted in the aerosol generating device 5 may control the LED 29 to emit light to display "a normal operational state" based on conditions, such as normal operation of a heater and/or a sufficient remaining battery capacity.

When a user manipulates the button 28 by pressing the button 28, the LED 29 emits light, and thus, the user may identify the remaining battery capacity from an emission color of the LED 29. For example, when the LED 29 emits green light, it may denote that the charged electricity of the battery is sufficient. When the LED 29 emits red light, it may denote that the charged electricity of the battery is insufficient.

Predetermined different operations may be performed according to a length of time for which the user presses the button 28. For example, when the user presses the button 28 for a predetermined first pressing time, a reset (initialization of settings) operation of the aerosol generating device 5 may be performed. Also, when the user presses the button 28 for a predetermined second pressing time, a preliminary heating operation of the aerosol generating device 5 may be performed.

Figure 9:
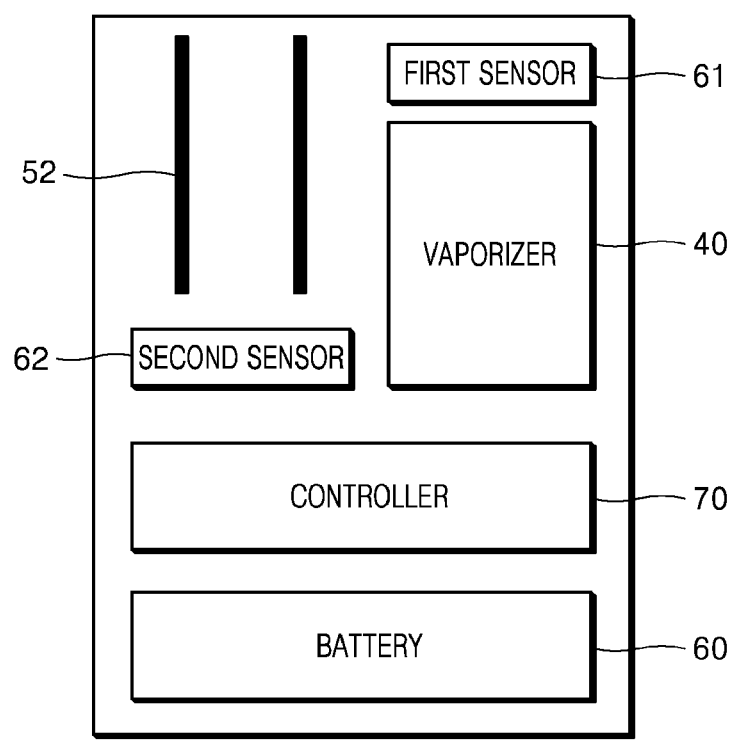
FIG. 9 is a view showing a structure of an aerosol generating device according to one or more exemplary embodiments.

FIG. 9 is a view showing a structure of an aerosol generating device according to an exemplary embodiment.

Referring to FIG. 9, the aerosol generating device 5 may further include a vaporizer 40, a heater 52, a battery 60, a first sensor 61, a second sensor 62, and a controller 70 in addition to the cap 10, the case 20, the button 28, and the cover 30 illustrated in FIGS. 4 through 8.

FIG. 9 only illustrates some components of the aerosol generating device 5, which will be explained in connection with the present exemplary embodiment. Thus, it would be understood by one of ordinary skill in the art that other general-purpose components may further be included in the aerosol generating device 5 in addition to the components illustrated in FIG. 9. For example, the aerosol generating device 5 may further include a memory (not shown).

A memory may be hardware storing various data processed in the aerosol generating device 5. For example, the memory may store data that is processed or is to be processed in the aerosol generating device 5. Also, the memory may store applications, drivers, etc. to be driven by the aerosol generating device 5.

The memory includes random access memory (RAM), such as dynamic RAM (DRAM) or static RAM (SRAM), read-only memory (ROM), an electrically erasable programmable (EEPROM), CD-ROM, a blue-ray or other optical disc storages, a hard disk drive (HDD), a solid state drive (SSD), or a flash memory, and may further include other external storage devices which may access the aerosol generating device 5.

The first sensor 61 may include a sensor configured to sense whether the cigarette insertion hole 18 is open or closed. For example, the first sensor 61 may include an on/off switch configured to generate an ON signal when the cover 30 moves to open the cigarette insertion hole 18 and an OFF signal when the cover 30 moves to close the cigarette insertion hole 18. However, it is not limited thereto, and the first sensor 61 may include any other appropriate sensor configured to sense sliding movement of the cover 30.

The second sensor 62 may include a sensor configured to sense whether or not the cigarette 7 is inserted into the case 20. For example, the second sensor 62 may include at least one of a Hall sensor configured to sense a change in a magnetic field generated from a metal material included in the cigarette 7, a mechanical switch configured to sense a physical change occurring when the cigarette 7 is inserted, an infrared sensor configured to sense the cigarette 7 approaching, and an optical sensor configured to sense a pattern printed on a surface of the cigarette 7. However, the second sensor 62 is not limited to the described examples, and may include any other appropriate sensor configured to sense whether or not the cigarette 7 is inserted into the case 20.

FIG. 9 illustrates that the first sensor 61 is arranged below the cover 30 and the second sensor 62 is arranged below the heater 52 in the case 20. However, the first sensor 61 and the second sensor 62 may be arranged differently in the case 20.

The heater 52 may be arranged in the case 20 and configured to heat the cigarette 7 inserted into the case 20. The heater 52 may correspond to a heater 13000 of FIGS. 1 and 2. The heater 52 may be arranged at a top portion of a supporting pipe in the case 20 and may be arranged to surround at least a portion of a side surface of the cigarette 7 inserted into the case 20. The heater 52 may be in the form of a film including an electric resistive pattern for generating heat when electricity is applied from the outside. The heater 52 may include, for example, a substrate including a material, such as polyimide, etc., and an electric resistive pattern arranged along a surface of the substrate.

The heater 52 may be coiled in a cylindrical shape or a semi-cylindrical shape corresponding to a shape of a heat transmission pipe and arranged to surround at least a portion of an outer surface of the heat transmission pipe. The terms "cylindrical shape" and "semi-cylindrical shape" do not necessarily refer to a case in which the heater 52 has a circular or semi-circular cross-sectional shape, and may refer to a case in which the heater 52 has a cross-sectional shape of a circular arc which is similar to a circle or a semi-circle.

The vaporizer 40 may accommodate a liquid composition and may be detachably coupled to the case 20. While being coupled to the case 20, the vaporizer 40 may transmit, to the cigarette 7, the aerosol generated by heating the liquid composition. The vaporizer 40 may correspond to the vaporizer 14000 of FIGS. 1 and 2, so similar descriptions will not be repeated.

The battery 60 may supply power to be used for an operation of the aerosol generating device 5. For example, the battery 60 may supply power to the controller 70, the heater 52, and the vaporizer 40. Also, the battery 60 may supply power required for operations of a display, a sensor, a motor, etc. mounted in the aerosol generating device 5. The battery 60 may include a LiFePO4 battery, but is not limited to the described example. For example, the battery 60 may include a LiCoO2 battery, a lithium titanate battery, etc. The battery 60 may correspond to the battery 11000 of FIGS. 1 and 2, so similar descriptions will not be repeated.

The controller 70 may include at least one processor. The processor may include an array of a plurality of logic gates, or may include a combination of a general-purpose microprocessor and a memory storing a program executable by the microprocessor. Also, it will be understood by one of ordinary skill in the art that the processor may include other types of hardware. For example, the processor may include an MCU, but is not limited thereto. The controller 70 may correspond to the controller 12000 of FIGS. 1 and 2, so similar descriptions will not be repeated.

The controller 70 may be implemented using, for example, a rigid circuit substrate or a flexible circuit substrate, or a plurality of circuit substrates. The controller 70 may include a semiconductor chip mounted on a circuit substrate or executable software equipped in the semiconductor chip. For example, the controller 70 may be divided into two or more circuit substrates or may be implemented by a single circuit substrate including a portion made using a flexible material.

The controller 70 may control overall operations of the aerosol generating device 5. For example, the controller 70 may control operations of the vaporizer 40, the heater 52, and the battery 60 and may control operations of other components included in the aerosol generating device 5. The controller 70 may control power supplied by the battery 60, heating elements included in the vaporizer 40, and a temperature of the heater 52. The controller 70 may identify a state of each component of the aerosol generating device 5 and may determine whether or not the aerosol generating device 5 is in an operable state.

In detail, the controller 70 may determine whether the cigarette insertion hole 18 is open or closed based on a signal sensed by the first sensor 61, and may set an operational mode of the aerosol generating device 5 as an ON mode or an OFF mode based on a result of the determination.

For example, when the controller 70 determines that the cigarette insertion hole 18 is open, the controller 70 may set the operational mode of the aerosol generating device 5 as the ON mode. When the operational mode of the aerosol generating device 5 is the ON mode, the controller 70 may electrically connect the battery 60 to the heater 52 and the vaporizer 40 so that the battery 60 may supply power to the heater 52 and the vaporizer 40, may activate the button 28 to receive a user's input, and may activate the second sensor 62 to sense whether or not the cigarette 7 is inserted into the case 20.

Also, when the operational mode of the aerosol generating device 5 is the ON mode, the controller 70 may activate a communication function of the aerosol generating device 5, such as a Bluetooth function, and may also activate various functions required for operations of the aerosol generating device 5.

When the battery 60 is electrically connected to the heater 52 and the vaporizer 40, the controller 70 may control the battery 60 to supply power to at least one of the heater 52 and the vaporizer 40. When the button 28 or the second sensor 62 is activated, a signal input from the button 28 or the second sensor 62 may not blocked. For example, when the button 28 or the second sensor 62 is activated, an interrupt function for standing by for a signal input from the button 28 or the second sensor 62 may be activated.

In an exemplary embodiment, when the operational mode of the aerosol generating device 5 is the ON mode, the controller 70 may control power supply to the heater 52 via the battery 60 such that the heater 52 is pre-heated to a predetermined temperature, when a user's input is received via the activated button 28.

Also, when the operational mode of the aerosol generating device 5 is the ON mode, the controller 70 may determine whether or not the cigarette 7 is inserted into the case 20 based on a signal sensed by the activated second sensor 62. When it is determined that the cigarette 7 is inserted into the case 20, the controller 70 may control power supply to the heater 52 via the battery 60 such that the heater 52 is pre-heated to a predetermined temperature.

When the operational mode of the aerosol generating device 5 is the ON mode, it denotes that the cigarette insertion hole 18 is open, and thus the user is expected to insert the cigarette 7 into the cigarette insertion hole 18 and smoke. In response to the user's input being received via the activated button 28 or the signal sensed by the second sensor 62 being received while the operational mode of the aerosol generating device 5 is the ON mode, the controller 70 may perform a preliminary heating operation of the heater 52 included in the aerosol generating device 5.

The disclosure is not limited to the example described above. According to another exemplary embodiment, when the operational mode of the aerosol generating device 5 is set as the ON mode (that is, when it is determined that the cigarette insertion hole 18 is open), the controller 70 may perform the preliminary heating operation of the heater 52 without waiting for a user's input via the activated button 28 or a signal sensed by the activated second sensor 62. Because the controller 70 does not wait for the user's input via the button 28 or the signal sensed by the second sensor 62 but performs the preliminary heating operation of the heater 52 as soon as it it senses that the cigarette insertion hole 18 is open, a stand-by time of the user before smoking using the aerosol generating device 5 may be minimized.

When the controller 70 determines that the cigarette insertion hole 18 is closed, the controller 70 may set the operational mode of the aerosol generating device 5 as an OFF mode. When the operational mode of the aerosol generating device 5 is the OFF mode, the controller 70 may electrically disconnect the battery 60 from the heater 52 and the vaporizer 40, may block a user's input that is input via the button 28, and may block a signal sensed by the second sensor 62.

When the battery 60 is electrically disconnected from the heater 52 and the vaporizer 40, the user's input that is input via the button 28 is blocked, and the signal sensed by the second sensor 62 is blocked. As a result, unintended operations of the aerosol generating device 5, which may occur when the button 28 is wrongly pressed, may be prevented, and unnecessary power consumption may be prevented while a user is not smoking.

Also, when the operational mode of the aerosol generating device 5 is the OFF mode, the controller 70 may inactivate a communication function of the aerosol generating device 5, such as a Bluetooth function, and may inactivate other functions which are not required when a user is not smoking by using the aerosol generating device 5.

Even when the operational mode of the aerosol generating device 5 is the OFF mode, functions related to booting of the aerosol generating device 5 may be activated. The functions related to booting may include at least one of a clock function, a real time clock (RTC) function, and an interrupt function for standing by for a signal sensed by the first sensor 61. Even when the operational mode of the aerosol generating device 5 is the OFF mode, the functions related to booting of the aerosol generating device 5 are activated, and thus, when the user intends to smoke, the aerosol generating device 5 may be smoothly booted, while unnecessary power consumption when the user is not smoking may be minimized.

Figure 10:
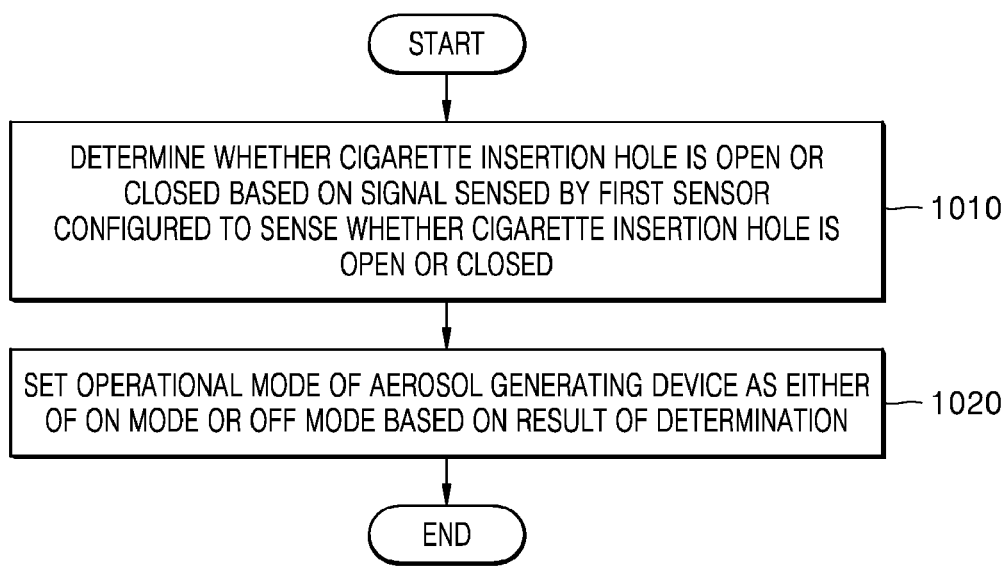
FIG. 10 is a flowchart showing an example of a method of controlling an aerosol generating device, according to one or more exemplary embodiments.

FIG. 10 is a flowchart showing an example of a method of controlling an aerosol generating device according to an exemplary embodiment.

Referring to FIG. 10, the method of controlling the aerosol generating device may include operations processed in a time-series manner by the aerosol generating device 10000 or the aerosol generating device 5 illustrated in FIGS. 1 through 9. Thus, even though certain descriptions are omitted hereinafter, it may be understood that the aspects described in relation to the aerosol generating device 10000 or the aerosol generating device 5 of FIGS. 1 through 9 may be applied to the method of controlling the aerosol generating device in FIG. 10.

In operation 1010, the aerosol generating device 10000 or the aerosol generating device 5 may determine whether the cigarette insertion hole 18 is open or closed based on a signal sensed by the first sensor 61 configured to sense whether the cigarette insertion hole 18 is open or closed.

In operation 1020, the aerosol generating device 10000 or the aerosol generating device 5 may set an operational mode of the aerosol generating device 10000 or 5 as an ON mode or an OFF mode based on a result of the determination. Hereinafter, the method of controlling the aerosol generating device is described in more detail with reference to FIG. 11.

FIG. 11 is a flowchart of another example of the method of controlling the aerosol generating device, according to an exemplary embodiment.

Referring to FIG. 11, the method of controlling the aerosol generating device may include operations processed in a time-series manner by the aerosol generating device 10000 or the aerosol generating device 5 illustrated in FIGS. 1 through 9. Thus, even though certain descriptions are omitted hereinafter, it may be understood that the aspects described in relation to the aerosol generating device 10000 or the aerosol generating device 5 of FIGS. 1 through 9 may be applied to the method of controlling the aerosol generating device in FIG. 11.

In operation 1110, the aerosol generating device 10000 or the aerosol generating device 5 may determine whether the cigarette insertion hole 18 is open or closed based on a signal sensed by the first sensor 61 configured to sense whether the cigarette insertion hole 18 is open or closed.

In operation 1120, when the aerosol generating device 10000 or the aerosol generating device 5 determines that the cigarette insertion hole 18 is open based on a result of the determination, the aerosol generating device 10000 or the aerosol generating device 5 may perform operation 1130, and when the aerosol generating device 10000 or the aerosol generating device 5 determines that the cigarette insertion hole 18 is closed, the aerosol generating device 10000 or the aerosol generating device 5 may perform operation 1135.

In operation 1130, the aerosol generating device 10000 or the aerosol generating device 5 may set an operational mode of the aerosol generating device 10000 or the aerosol generating device 5 as an ON mode. When the operational mode of the aerosol generating device 10000 or the aerosol generating device 5 is set as the ON mode, the battery 60 may be electrically connected with the heater 52 and the vaporizer 40 so that the battery 60 may supply power to the heater 52 and the vaporizer 40. Also, the button 28 may be activated to receive a user's input, and the second sensor 62 may be activated to sense whether or not the cigarette 7 is inserted into the case 20.

When the aerosol generating device 10000 or 5 receives a user's input via the button 28 or a signal sensed by the second sensor 62 while the operational mode of the aerosol generating device 10000 or the aerosol generating device 5 is set as the ON mode, the aerosol generating device 10000 or the aerosol generating device 5 may perform operation 1140. In operation 1140, the aerosol generating device 10000 or the aerosol generating device 5 may control power supply to the heater 52 via the battery 60 such that the heater 52 is pre-heated to a predetermined temperature.

Meanwhile, in operation 1135, the aerosol generating device 10000 or the aerosol generating device 5 may set the operational mode of the aerosol generating device 10000 or the aerosol generating device 5 as an OFF mode. When the operational mode of the aerosol generating device 10000 or the aerosol generating device 5 is set as the OFF mode, the battery 60 may be electrically disconnected from the heater 52 and the vaporizer 40. As such, a user's input that is input via the button 28 may be blocked, and a signal sensed by the second sensor 62 may be blocked.

When the operational mode of the aerosol generating device 10000 or the aerosol generating device 5 is set as the OFF mode, even when the user's input is received via the button 28 or the signal is sensed by the second sensor 62, the aerosol generating device 10000 or the aerosol generating device 5 may block the user's input received via the button 28 or the signal sensed by the second sensor 62, as shown in operation 1145. Accordingly, execution of unintended operations of the aerosol generating device 10000 or the aerosol generating device 5 may be prevented when the button 28 is wrongly pressed, and unnecessary power consumption may be prevented when the user is not smoking.

The method of controlling the aerosol generating device of FIGS. 10 and 11 may be recorded in a computer-readable recording medium having recorded thereon at least one program including instructions for executing the method. Examples of the computer-readable recording medium may include magnetic media, such as a hard disk, a floppy disk, and a magnetic tape, optical media, such as CD-ROM, DVD, etc., magneto-optical media, such as a floptical disk, etc., and hardware devices, such as ROM, RAM, and flash memories, configured to store and execute program commands. Examples of the program instructions include high-level language code that may be executed by a computer using an interpreter as well as machine language code made by a compiler.

It will be understood by one of ordinary skill in the art that various changes in form and details may be made in the exemplary embodiments without departing from the spirit and scope of the exemplary embodiments. Therefore, the exemplary embodiments should be considered in a descriptive sense only and not for purposes of limitation. The scope of the disclosure is defined not by the detailed description of the disclosure but by the appended claims, and all differences within the scope will be construed as being included in the disclosure.

What is claimed is:

1. An aerosol generating device comprising:
   a case into which a cigarette is to be inserted;
   a cap detachably coupled to a top portion of the case;
   a cover configured to move on a top surface of the cap, thereby opening or closing a cigarette insertion hole;
   a first sensor configured to sense whether the cigarette insertion hole is open or closed;
   a heater arranged in the case and configured to heat the cigarette inserted into the case;
   a button; and
   a controller configured to determine whether the cigarette insertion hole is open or closed based on a signal sensed by the first sensor,
   characterized in that the controller is configured to:
   determine whether the button is pressed as a first input for a predetermined first time period based on the cigarette insertion hole being open, and
   control power to be supplied to the heater such that the heater is pre-heated in response to the first input, wherein power is not supplied to the heater in response to the button being pressed when the cigarette insertion hole is closed such that pre-heating is not performed when the cigarette insertion hole is closed,
   wherein the controller is further configured to perform a reset operation of the aerosol generating device based on a second input received via the button for a predetermined second time period.

2. The aerosol generating device of claim 1, further comprising:
   a second sensor configured to sense whether or not the cigarette is inserted into the case;
   a vaporizer detachably coupled to the case and configured to accommodate a liquid composition and, while being coupled to the case, transmit aerosol, which is generated by heating the liquid composition, to the cigarette; and
   a battery configured to supply power to the controller, the heater, and the vaporizer.

3. The aerosol generating device of claim 2, wherein the controller is further configured to,
   when the cigarette insertion hole is open, electrically connect the battery to the heater and the vaporizer, and activate the second sensor to sense whether or not the cigarette is inserted into the case.

4. The aerosol generating device of claim 3, wherein, when the cigarette insertion hole is open, the controller is further configured to determine whether or not the cigarette is inserted into the case based on a signal sensed by the activated second sensor, and
   in response to determining that the cigarette is inserted into the case, control power to be supplied to the heater via the battery such that the heater is pre-heated to a predetermined temperature.

5. The aerosol generating device of claim 2, wherein the controller is configured to
   when the cigarette insertion hole is closed, electrically disconnect the battery from the heater and the vaporizer, block the input received through the button, and block a signal sensed by the second sensor.

6. The aerosol generating device of claim 1, wherein, when the cigarette insertion hole is closed, the controller is further configured to activate functions related to booting of the aerosol generating device, and the functions related to booting comprise at least one of a clock function, a real time clock (RTC) function, and an interrupt function for standing by for the signal sensed by the first sensor.

7. The aerosol generating device of claim 1, wherein the first sensor comprises an ON/OFF switch configured to generate an ON signal when the cover moves to open the cigarette insertion hole and generate an OFF signal when the cover moves to close the cigarette insertion hole.

8. The aerosol generating device of claim 2, wherein the second sensor comprises at least one of a Hall sensor configured to sense a change in a magnetic field generated from a metal material included in the cigarette, a mechanical switch configured to sense a physical change occurring when the cigarette is inserted, an infrared sensor configured to sense approaching of the cigarette, and an optical sensor configured to sense a pattern printed on a surface of the cigarette.

* * * * *